United States Patent [19]
Hynecek et al.

[11] Patent Number: 5,453,632
[45] Date of Patent: Sep. 26, 1995

[54] ADVANCED LATERAL OVERFLOW DRAIN ANTIBLOOMING STRUCTURE FOR VIRTUAL GATE PHOTOSITES

[75] Inventors: Jaroslav Hynecek, Richardson, Tex.; Hiroaki Shibuya, Toride; Hirofumi Komori, Tsukuba, both of Japan

[73] Assignee: Texs Instrument Incorporated, Dallas, Tex.

[21] Appl. No.: 220,087

[22] Filed: Mar. 30, 1994

[51] Int. Cl.⁶ .................................... H01L 29/78
[52] U.S. Cl. .................... 257/247; 257/223; 257/230; 257/243
[58] Field of Search .................................. 257/223, 230, 257/243, 247

[56] References Cited

U.S. PATENT DOCUMENTS 5,151,380  9/1992  Hynecek .
5,286,990  2/1994  Hynecek ................... 257/247
5,341,008  8/1994  Hynecek ................... 257/247

OTHER PUBLICATIONS

A Channel-Stop Defined Barrier and Drain Antiblooming Structure for Virtual Phase CCD Image Sensors, W. F. Keenan, et al., IEEE Transaction on Electron Devices, vol. No. 36, Sep. 1989.

*Primary Examiner*—Ngân V. Ngô
*Attorney, Agent, or Firm*—Alan K. Stewart; Richard L. Donaldson; William E. Hiller

[57] ABSTRACT

The lateral overflow drain for virtual phase devices includes: a semiconductor region 72 of a first conductivity type; a drain region 24 of the first conductivity type formed in the semiconductor region 72; a threshold adjust region 22 formed in the semiconductor region 72 and surrounding the drain region 24; an electrode 20 overlying and connected to the drain region 24, the electrode 20 overlying and separated from at least a portion of the threshold adjust region 22; and virtual gates 30 and 32 of the second conductivity type in the semiconductor region 72 spaced apart from the drain region 24 and partially surrounding the drain region 24.

16 Claims, 2 Drawing Sheets

ADVANCED LATERAL OVERFLOW DRAIN ANTIBLOOMING STRUCTURE FOR VIRTUAL GATE PHOTOSITES

CROSS-REFERENCE TO RELATED APPLICATIONS

| Ser. No. | Filing Date | TI Case No. |
|---|---|---|
|  | 3/30/94 | TI-19090 |

1. Field of the Invention

This invention generally relates to image sensor devices, and more particularly relates to charge coupled devices.

2. Background of the Invention

Without limiting the scope of the invention, its background is described in connection with antiblooming structures for charge coupled device image sensors, as an example. Antiblooming action is important for operation of CCD sensor imaging scenes whose range of illumination intensities greatly exceeds the dynamic range of the sensor. With strong antiblooming action, the optical system can be adjusted for optimum performance at low light levels, and the high overloads associated with the bright portions of the scene can be absorbed by the antiblooming. Two major forms of antiblooming exist in the prior art. One uses charge recombination at the semiconductor-insulator interface to remove excess charge while the other forms a barrier and drain structure next to or underneath the pixel that removes any charge in excess of full well. Disadvantages of the charge recombination antiblooming include: large size; limited charge removal rate which is particularly a problem for short duration light pulses; constant clocking which causes large power consumption; and large interface state density which creates problems for dark current generation which is increased by high interface state density.

SUMMARY OF THE INVENTION

It has been discovered that the prior art antiblooming structures are not suitable for small pixel virtual phase CCD designs.

Generally, and in one form of the invention, a lateral overflow drain for virtual phase devices includes: a semiconductor region of a first conductivity type; a drain region of the first conductivity type formed in the semiconductor region; a threshold adjust region formed in the semiconductor region and surrounding the drain region; an electrode overlying and connected to the drain region, the electrode overlying and separated from at least a portion of the threshold adjust region; and virtual gates of the second conductivity type in the semiconductor region spaced apart from the drain region and partially surrounding the drain region.

This invention provides several advantages such as compatibility with existing virtual phase processes; no reliance on interface state density control; no significant reduction in quantum efficiency; a high near infra red sensitivity of virtual phase CCD devices is maintained; the potential can be controlled by applying bias to the structure; the antiblooming barrier can be lowered by applying a suitable bias to clear the photosite of all collected charge; all photosites can be simultaneously cleared; and a single interconnect line provides the drain bias as well as the barrier bias.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
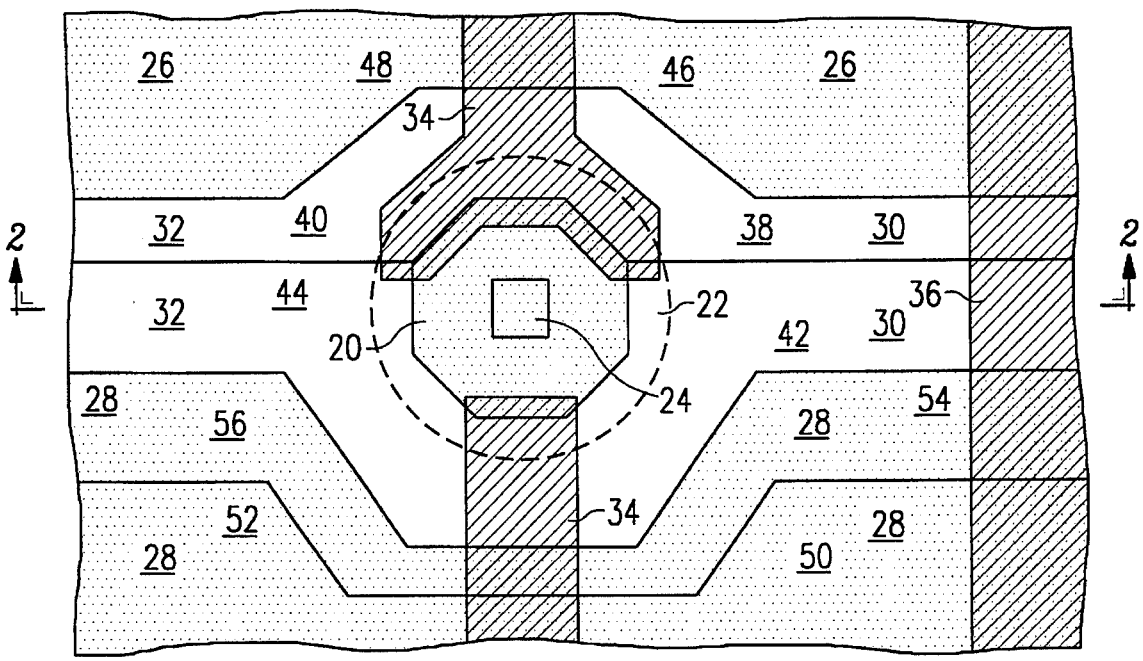
FIG. 1 is a plan view of a first preferred embodiment advanced lateral overflow drain antiblooming structure.

Referring to FIG. 1, a plan view of a first preferred embodiment advanced lateral overflow drain antiblooming structure is shown. The antiblooming structure shown in FIG. 1 includes drain electrode 20, threshold adjust implants 22, N+ region (drain) 24, clocked gates 26 and 28, virtual gates 30 and 32, channel stops 34 and 36, virtual barriers 38 and 40 below the virtual gates, virtual wells 42 and 44 below the virtual gates, clocked wells 46, 48, 50, and 52 below the clocked gates, and clocked barriers 54 and 56 below the clocked gates. The antiblooming structure is formed at a face of a P type semiconductor substrate or layer. The antiblooming structure is surrounded by virtual phase charge coupled device (CCD) cells arranged in a plurality of rows and columns. The semiconductor layer is preferably a semiconductor substrate, but can take other forms such as an epitaxial layer.

Figure 2:
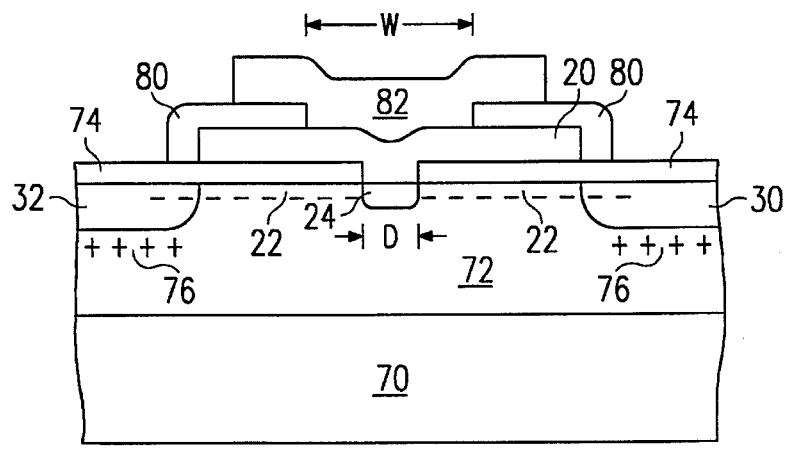
FIG. 2 is a cross-section of a first preferred embodiment lateral overflow drain antiblooming structure.

FIG. 2 is a cross-section taken along the axis A–A' of the first preferred embodiment lateral overflow drain shown in FIG. 1. The structure of FIG. 2 includes a P type silicon layer 70, an N type layer 72 in the layer 70, P+ virtual gates 30 and 32 formed in the upper portion of N type layer 72, N+ drain (lateral drain) 24, gate insulator layer 74, drain electrode 20, virtual well donor implants 76 in the N type layer 72, threshold adjust implant 22 below the drain electrode 20, insulator layer 80, and drain interconnect (conductive interconnect) 82.

Figure 4:
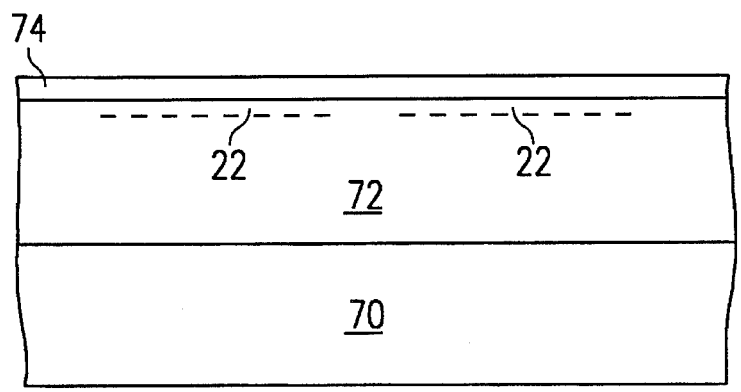
FIGS. 4–6 show the device of FIG. 2 at three stages of fabrication.
Figure 5:
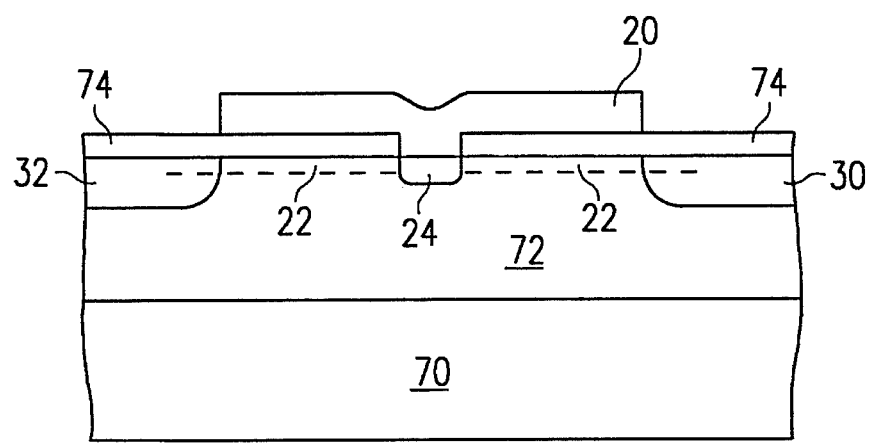
Figure 6:
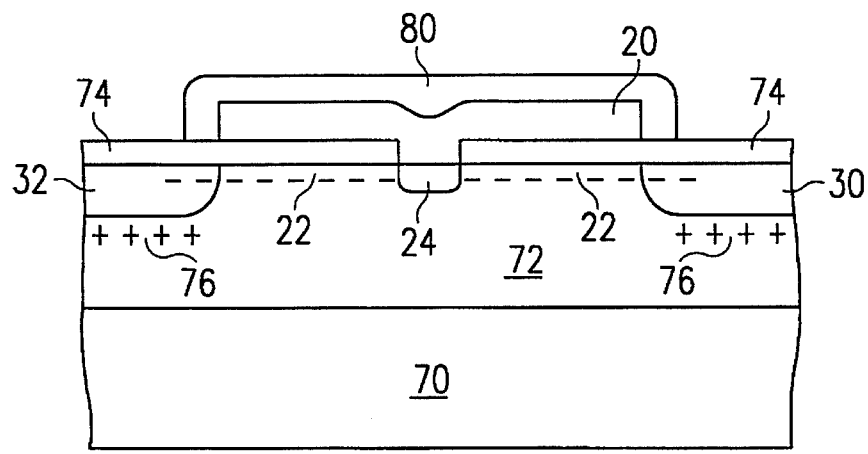

FIGS. 4–6 illustrate successive steps in a process for fabricating a lateral charge drain according to the preferred embodiment, as shown in FIG. 2. Referring first to FIG. 4, an N type layer 72 is formed in P type semiconductor layer 70. N type layer 72 may be formed by ion implantation. A dopant such as phosphorus may be used as the implant dopant. Next, the channel stop regions 34 and 36, shown in FIG. 1, are formed. Then a gate insulator layer 74 is formed over the surface of the device. The gate insulator layer 74 is preferably formed of oxide and may be gate insulator layer 74 is preferably formed of oxide and may be grown from the substrate. Next, a photoresist layer is used to pattern an implant into N type layer 72 to form the threshold adjust implants 22 (acceptor implants) shown in FIG. 4. This implant is done with a P type dopant such as boron. By using the threshold adjust implant 22 under the clear drain electrode 20, the clear drain electrode 20 also serves as a gate which forms the antiblooming barrier.

After the photoresist layer is stripped, insulator layer 74 is patterned and etched to provide an opening for forming N+ drain 24. The N+ drain 24 can be formed by implanting an N type dopant such as phosphorous. The N+ drain 24 can also be formed by diffusion from the clear drain electrode 20. The dimension D, shown in FIG. 2, is on the order of 0.5 microns in the preferred embodiment. Then the clear drain electrode 20 along with the clocked gates 26 and 28 of the virtual phase CCD, shown in FIG. 1, are deposited, doped to be conductive, patterned, and etched, as shown in FIG. 5. The drain electrode 20 contacts N+ drain 24 and is over a portion of insulator layer 74. The electrode 20 is formed of a material such as doped polysilicon. For a polysilicon electrode, from 500 to 5000 Angstroms of a polysilicon layer is deposited, doped, patterned, and etched to form electrode 36. The polysilicon electrode 20 may be doped in place by a dopant such as phosphoric oxytrichloride ($POCl_3$).

After the electrode 20 is patterned and etched, it can be used in a self-aligned process as a mask for implantation of P+ virtual gates 30 and 32. P+ virtual gates 30 and 32 are patterned using photoresist. Then a dopant such as boron is implanted into N type layer 72 to form P+ virtual gates 30 and 32, shown in FIG. 5 Then a photoresist layer may be used to pattern an implant to form the donor implants 76 shown in FIG. 6. The donor implants 76 are also made in a self aligned manner. This implant is done with an N type dopant such as phosphorous.

Then an insulator layer 80 is formed over the surface of the structure, as shown in FIG. 6. Insulator layer 80 can be formed of oxide. Next, a contact opening to the drain electrode 20 is patterned and etched through the insulator layer 42, as shown in FIG. 2. The dimension W of the contact opening is on the order of 1.4 microns in the preferred embodiment. Then a metal layer is deposited and etched to form conductive interconnect 82, as shown in FIG. 2.

The operation of the device of FIGS. 1 and 2 is described below and is illustrated by the potential profile shown in FIG. 3, directly below the corresponding regions of the device of FIG. 2. The regions below the P+ virtual gates 30 and 32 are the virtual wells 42 and 44, the region below the threshold adjust implant 22 is the antiblooming barrier 100. Region 102 is the drain.

Figure 3:
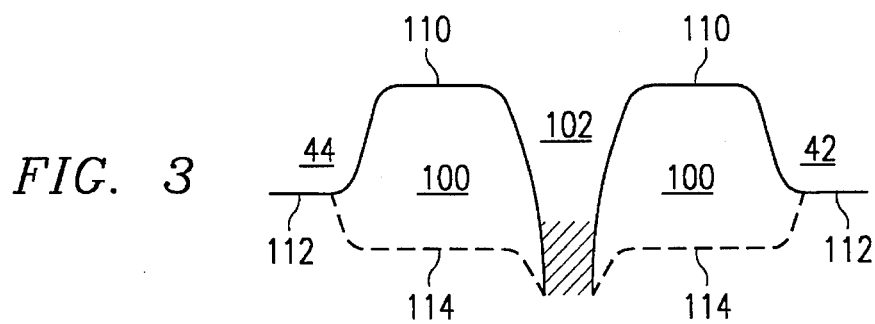
FIG. 3 is a diagram of the potential wells created by the device of FIG. 2.

For antiblooming, the drain electrode 20 is biased such that the potential level 110 of the antiblooming barrier 100 is lower than the potential level 112 of the virtual wells 42 and 44, as shown in FIG. 3. When excess charge accumulates in virtual well 42 or 44, the potential level of the virtual well is lowered below the potential level 110 of the antiblooming barrier 100. Then the excess charge from the virtual well flows across the antiblooming barrier 100 and into the drain 102.

For charge clearing purposes, the drain electrode 20 is biased more positive such that the potential level 114 of the antiblooming barrier 100 is higher than the virtual wells 42 and 44. This allows all charge in the virtual wells 42 and 44 to flow across the antiblooming barrier 100 and out through the drain 102. Charge removal from the virtual wells 42 and 44 resets the photocell for the next charge integration period. This reset process provides a complete charge removal from the structure because there is no charge remaining in the virtual wells 42 and 44 after the charge is transferred to the drain 102.

This preferred embodiment provides several advantages. A first advantage is the small size of the contact to the N+ region. The contact opening can be easily formed through the thin gate oxide. The N+ region can be doped either by implant using the same mask as the one for the oxide etching which provides a self aligning feature, or simply by N+ diffusion from the drain electrode. A second advantage is that the drain interconnect is to the top of the polysilicon drain electrode instead of directly to the N+ region which is smaller. Also, only one metal interconnect line is used for both the drain bias and the antiblooming barrier bias. The contact is easily made by a conventional 1.4 micron process. A third advantage is that the structure is fully compatible with existing virtual phase processes. In addition, the embodiment does not rely on interface state density control. Therefore, methods for minimizing interface states can be used which in turn reduces dark current. A fourth advantage is that the lateral overflow drain does not significantly reduce quantum efficiency. The active charge collection region in the vertical direction was not reduced as is the case for vertical overflow drain structures. This feature maintains a high near infra red sensitivity of virtual phase CCD devices. A fifth advantage is that the potential can be controlled by applying bias to the structure. It is also possible to lower the antiblooming barrier completely by applying a suitable bias such as twelve volts and clear the photosite of all collected charge. All photosites can be simultaneously cleared.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A lateral overflow drain for charge coupled devices comprising:

a semiconductor region of a first conductivity type;

a drain region of the first conductivity type formed in the semiconductor region;

a threshold adjust region formed in the semiconductor region and surrounding the drain region;

an electrode overlying and connected to the drain region, the electrode overlying and separated from at least a portion of the threshold adjust region; and at least one virtual gate of the second conductivity type in the semiconductor region spaced apart from the drain region and partially surrounding the drain region.

2. The device claim 1 further comprising a channel stop region in the semiconductor region spaced apart from the drain region, partially surrounding the drain region, and adjacent the virtual gate.

3. The device of claim 1 further comprising a conductive interconnect overlying and connected to a first portion of the electrode.

4. The device of claim 3 further comprising an insulator layer over a second portion of the electrode and below a portion of the conductive interconnect.

5. The device of claim 3 wherein the conductive interconnect is metal.

6. The device of claim 1 further comprising donor implants underlying at least a portion of the virtual gate.

7. The device of claim 1 wherein the electrode is held at a first voltage for antiblooming and at a second voltage for clearing charge from virtual wells, the second voltage is higher than the first voltage.

8. The device of claim 1 wherein the virtual gate forms a virtual barrier region and a virtual well region.

9. The device of claim 8 wherein the virtual barrier region is isolated from the drain region by a channel stop region.

10. The device of claim 1 further comprising a semiconductor layer of the second conductivity type underlying the semiconductor region.

11. The device of claim 1 wherein the electrode is polysilicon.

12. The device of claim 1 further comprising an insulator layer between the threshold adjust region and the electrode.

13. The device of claim 1 wherein the threshold adjust region is formed by acceptor implants.

14. A lateral overflow drain for charge coupled devices comprising:

a semiconductor region of a first conductivity type;

a drain region of the first conductivity type formed in the semiconductor region;

a threshold adjust region formed in the semiconductor region and surrounding the drain region;

at least one virtual gate of the second conductivity type in the semiconductor region spaced apart from the drain region and partially surrounding the drain region, the virtual gate forms a virtual well for carriers of the first conductivity type; and an electrode overlying and connected to the drain region, the electrode overlying and separated from at least a portion of the threshold adjust region, the electrode and the threshold adjust region form an antiblooming barrier between the virtual well and the drain region.

15. The device of claim 14 further comprising donor implants in the semiconductor region below a portion of the virtual gate.

16. The device of claim 14 wherein the threshold adjust region is formed by acceptor implants.

* * * * *